(12) United States Patent
Kalevo et al.

(10) Patent No.: US 8,816,460 B2
(45) Date of Patent: Aug. 26, 2014

(54) IMAGE SENSOR

(75) Inventors: Ossi M. Kalevo, Toijala (FI); Samu T. Koskinen, Tampere (FI); Tero Rissa, Siivikkala (FI)

(73) Assignee: Nokia Corporation, Espoo (FI)

( * ) Notice: Subject to any disclaimer, the term of this patent is extended or adjusted under 35 U.S.C. 154(b) by 244 days.

(21) Appl. No.: 12/384,549

(22) Filed: Apr. 6, 2009

(65) Prior Publication Data

US 2010/0252716 A1    Oct. 7, 2010

(51) Int. Cl.
*H01L 31/00* (2006.01)

(52) U.S. Cl.
USPC ............... 257/440; 257/443; 257/E27.134; 250/208.1

(58) Field of Classification Search
USPC ............ 327/515; 250/492.2, 264, 269.2, 265, 250/266, 208.1, 208.2, 226; 257/225, 233, 257/440, 443, 444, E27.13, E27.131, 257/E27.132, E27.133, E27.134, E27.135, 257/E27.136, E27.138, E27.142, E27.143
See application file for complete search history.

(56) References Cited

U.S. PATENT DOCUMENTS

| | | | |
|---|---|---|---|
| 3,981,565 A | 9/1976 | Karasawa | 359/234 |
| 4,011,016 A | 3/1977 | Layne et al. | 356/195 |
| 5,965,875 A | 10/1999 | Merrill | 250/226 |
| 6,252,577 B1 | 6/2001 | Rashkovskiy et al. | 345/670 |
| 6,498,576 B1 * | 12/2002 | Tian et al. | 341/155 |
| 6,552,746 B1 * | 4/2003 | Yang et al. | 348/308 |
| 6,704,046 B2 | 3/2004 | Dyas et al. | 348/223.1 |
| 6,727,521 B2 | 4/2004 | Merrill | 257/98 |
| 6,864,557 B2 | 3/2005 | Turner et al. | 257/440 |
| 6,924,167 B1 | 8/2005 | Hopper et al. | 438/57 |
| 6,960,757 B2 | 11/2005 | Merrill et al. | 250/256 |
| 7,166,880 B2 | 1/2007 | Merrill et al. | 257/294 |
| 7,916,193 B2 | 3/2011 | Fossum | 348/272 |
| 2002/0114526 A1 | 8/2002 | Dennis | 382/232 |
| 2002/0171881 A1 * | 11/2002 | Merrill et al. | 358/513 |
| 2003/0209651 A1 | 11/2003 | Iwasaki | 250/214.1 |
| 2004/0085468 A1 * | 5/2004 | Knee et al. | 348/308 |
| 2004/0178465 A1 * | 9/2004 | Merrill et al. | 257/440 |
| 2004/0218073 A1 | 11/2004 | Kalevo et al. | 348/272 |
| 2004/0245592 A1 | 12/2004 | Harmon et al. | 257/438 |

(Continued)

FOREIGN PATENT DOCUMENTS

| | | | |
|---|---|---|---|
| EP | 1667246 A1 | 6/2006 |
| EP | 1667246 A1 | 6/2006 |

(Continued)

OTHER PUBLICATIONS

"Digital optical position-sensitive detector (PSD)", Anssi Makynen, et al., IMTC 2004—Instrumentation and Measurement, IEEE 2004, pp. 2358-2360.

(Continued)

*Primary Examiner* — Benjamin Sandvik
*Assistant Examiner* — Leslie Pilar Cruz
(74) *Attorney, Agent, or Firm* — Harrington & Smith

(57) ABSTRACT

An apparatus includes a three dimensional array of light receptors disposed within a substrate having a light receiving surface, where light receptors disposed closer to the light receiving surface are responsive to light having shorter wavelengths than light receptors disposed further from the light receiving surface, and where each light receptor is configured to output a binary value and to change state between an off-state and an on-state by the absorption of at least one photon.

14 Claims, 9 Drawing Sheets

(56) References Cited

U.S. PATENT DOCUMENTS

| | | |
|---|---|---|
| 2005/0185075 A1 | 8/2005 | Neter .................... 348/294 |
| 2006/0012832 A1 | 1/2006 | Kayanuma ............. 359/296 |
| 2006/0033114 A1* | 2/2006 | Schranz .................. 257/88 |
| 2006/0054782 A1 | 3/2006 | Olsen et al. ........... 250/208.1 |
| 2006/0124832 A1 | 6/2006 | Harmon et al. ....... 250/214 R |
| 2007/0045685 A1 | 3/2007 | Yang et al. ............. 257/294 |
| 2008/0011937 A1 | 1/2008 | Toshikiyo ............. 250/208.1 |
| 2008/0128698 A1 | 6/2008 | Martin et al. ............ 257/55 |
| 2009/0152664 A1* | 6/2009 | Klem et al. ............ 257/440 |
| 2009/0251581 A1 | 10/2009 | Cha et al. .............. 348/308 |
| 2010/0033604 A1 | 2/2010 | Solomon ............... 348/241 |
| 2010/0073294 A1 | 3/2010 | Kim et al. .............. 345/166 |
| 2010/0320368 A1 | 12/2010 | Koskinen et al. ..... 250/226 |
| 2010/0320369 A1 | 12/2010 | Koskinen et al. ..... 250/226 |
| 2010/0321542 A1 | 12/2010 | Koskinen et al. ..... 348/273 |

FOREIGN PATENT DOCUMENTS

| | | |
|---|---|---|
| EP | 2 149 904 A2 | 2/2010 |
| JP | 2005-268384 | 9/2005 |
| KR | 1020020077793 A | 10/2002 |
| KR | 1008751400000 | 12/2008 |
| WO | WO-2004/0099865 A2 | 11/2004 |
| WO | WO-2004-099865 A2 | 11/2004 |
| WO | 2009/136989 A1 | 6/2008 |
| WO | WO 2008/067472 A2 | 6/2008 |
| WO | WO 2008/082569 A1 | 7/2008 |
| WO | WO-2008/131313 A2 | 10/2008 |

OTHER PUBLICATIONS

Gigapixel Digital Film Sensor (DFS) Proposal, Eric R. Fossum, $7^{th}$ Takayanagi Kenjiro Memorial Symposium and the $2^{nd}$ International Symposium on Nanovision Science, University of Shizuoka, Oct. 2005, 5 pgs.

"Bayer filter", http://en.wikipedia.org/wiki/Bayer_filter, May 15, 2009, 4 pgs.

"Foveon X3 sensor", http://en.wikipedia.org/wiki/Foveon_X3_sensor , May 15, 2009.

L. Sbaiz, et al, "The Gigavision Camera", IEEE International Conference on Acoustics, Speech and Signal Processing 2009, pp. 1093-1096, Apr. 19-24, 2009.

E. Fossum, "Gigapixel Digital Film Sensor (DFS) Proposal", Nanospace Manipulation of Photons and Electrons for Nanovision Systems, Oct. 25-26, 2005.

* cited by examiner

9A

ILLUMINATING A LIGHT RECEIVING SURFACE OF SUBSTRATE COMPRISING A THREE DIMENSIONAL ARRAY OF LIGHT RECEPTORS, WHERE LIGHT RECEPTORS DISPOSED IN AN X-Y PLANE THAT IS CLOSER TO THE LIGHT RECEIVING SURFACE ARE RESPONSIVE TO LIGHT HAVING SHORTER WAVELENGTHS THAN LIGHT RECEPTORS DISPOSED IN AN X-Y PLANE THAT IS FURTHER FROM THE LIGHT RECEIVING SURFACE, AND WHERE EACH LIGHT RECEPTOR IS CONFIGURED TO OUTPUT A BINARY VALUE AND TO CHANGE STATE BETWEEN AN OFF-STATE AND AN ON-STATE BY THE ABSORPTION OF AT LEAST ONE PHOTON

9B

AT THE END OF AN EXPOSURE PERIOD, READING OUT BINARY VALUES FROM LIGHT RECEPTORS DISPOSED IN AT LEAST TWO DIFFERENT X-Y PLANES OF THE THREE DIMENSIONAL ARRAY

FIG.9

IMAGE SENSOR

TECHNICAL FIELD

The exemplary embodiments of this invention relate generally to sensors of electromagnetic radiation and, more specifically, relate to solid state image sensor arrays capable of detecting light in a plurality of different wavelength bands (multi-color).

BACKGROUND

Two dimensional pixel array light sensors may be used with a color filter array for achieving multi-color detection and imaging.

In addition, there are light sensor arrays that do not require color filters, as the detection of color is based on the depth of the light sensitive areas or pixels within a semiconductor substrate. These types of sensors may rely on the wavelength-dependent absorption coefficient of silicon (Si).

A double-layer photodiode has previously been described that is created in an integral structure to form two diodes, where an upper diode has a relatively thin active region and a lower diode a relatively thick active region. Light whose wavelength is to be measured is directed onto the upper diode. The thickness of the first diode is chosen so that, in the spectrum of light wavelengths being measured, the energy of the shortest wavelength is entirely absorbed in the first diode. As the radiation wavelength increases, the absorption by the upper diode decreases exponentially, and the unabsorbed light is transmitted through the thin active region into the thick active region of the lower diode where it is absorbed. The thickness of the active region of the lower diode is chosen so that it absorbs substantially all of the energy of the longest wavelength in the spectrum being measured. The absorption of the photon energy in each diode creates electron-hole pairs therein which produce in each diode a change in conductivity that is proportional to the absorbed energy. Since the difference in conductivities of the two diodes is a function of the wavelength of the incident light, as the wavelength changes, the difference between the changes in the conductivity of the two diodes, divided by the sum of the changes in the conductivity, is a function which is a single-valued function of the wavelength of the incident light, and which is independent of the intensity of the incident light. A measuring circuit connected to the double-layer diode provides a direct reading of the wavelength.

FIG. 1 shows the absorption coefficient of silicon (Si) as a function of wavelength.

A digital imager apparatus has been described that uses the differences in absorption length in silicon of light of different wavelengths for color separation. A preferred imaging array is said to be based upon a three-color pixel sensor using a triple-well structure. The array is said to result in elimination of color aliasing by measuring each of the three primary colors (RGB) in each pixel in the same location.

FIG. 2 shows a three-color pixel sensor that uses the triple-well structure.

FIG. 3 depicts a graph that plots light absorption length in Si versus wavelength.

A two dimensional 1-bit receptor array has been described as a digital-film sensor (DFS), which is an array of deep-SDL (sub-diffraction-limit) pixels, defined as those smaller than a 550 nm Airy disk diameter, wherein each pixel is a fraction of a micron in size. While several photoelectrons could contribute to pushing the output signal above some threshold, ultimately single photoelectron sensitivity is said to be desired. It is said that a pixel that only needs to detect a single photoelectron has much lower performance requirements for full-well capacity and dynamic range than an analog pixel in a conventional image sensor. These specialized pixels have been referred to as "jots".

A jot may be implemented by making a conventional active pixel with very high conversion gain (low capacitance). Other approaches are said to include using avalanche or impact ionization effects to achieve in-pixel gain, as well as the possible application of quantum dots and other nanoelectronic devices. It is stated that stacked structures are also possible.

In operation, at the start of the exposure period the jot would be reset to a logical '0'. If it is then hit by a photon during exposure the jot is set to a logical '1' immediately or upon readout. Due to the single-bit nature of the "analog-to-digital" conversion resolution, it is said that high row-readout rates can be achieved.

It is said that color can be handled in a manner analogous to current color image sensors. That is, the jots could be covered with color filters. In this case red (R), green (G) and blue (B) jots could be treated separately, and later the digitally developed images combined to form a conventional RGB image. R, G, and B jots need not appear at the same spatial frequency.

SUMMARY

The foregoing and other problems are overcome, and other advantages are realized, in accordance with the exemplary embodiments of this invention.

In one aspect thereof the exemplary embodiments of this invention provide an apparatus that comprises a three dimensional array of light receptors disposed within a substrate having a light receiving surface, where light receptors disposed closer to the light receiving surface are responsive to light having shorter wavelengths than light receptors disposed further from the light receiving surface, and where each light receptor is configured to output a binary value and to change state between an off-state and an on-state by the absorption of at least one photon.

In another aspect thereof the exemplary embodiments of this invention provide a method that comprises illuminating a light receiving surface of substrate comprising a three dimensional array of light receptors, where light receptors disposed in an x-y plane that is closer to the light receiving surface are responsive to light having shorter wavelengths than light receptors disposed in an x-y plane that is further from the light receiving surface. Each light receptor is configured to output a binary value and to change state between an off-state and an on-state by the absorption of at least one photon. The method further comprises, at the end of an exposure period, reading out binary values from light receptors disposed in at least two different x-y planes of the three dimensional array.

BRIEF DESCRIPTION OF THE DRAWINGS

The foregoing and other aspects of the presently preferred embodiments of this invention are made more evident in the following Detailed Description of the Preferred Embodiments, when read in conjunction with the attached Drawing Figures, wherein:

FIG. 9 is a logic flow diagram that is descriptive of the operation of a method, as well as the execution of computer program instructions, in accordance with exemplary embodiments of this invention.

DETAILED DESCRIPTION

The exemplary embodiments of this invention relate at least in part to imaging sensor technology, such as technologies used in color cameras. As was discussed above, some current color camera sensors are implemented by using two dimensional pixel arrays that measure light levels by storing charges generated by incoming light. A color filter array disposed between the pixel array and the incoming light enables the pixel array to detect color. The stored charges may be digitized by using floating diffusion and analog to digital converter (ADC) circuitry. The detected image(s) are then processed and the result is a stored image or video.

There are a number of problems associated with conventional image sensor technology. For example, the color accuracy may be less than optimum because, typically, only three different color filters are used. However, increasing the number of color filters decreases the resolution. Further, color filters can reduce the sensitivity of the sensor since there are optical losses in the filters, resulting in a loss of photons that are not available for imaging purposes. It is also difficult to increase the image resolution since each pixel requires some number of transistors, thereby setting a minimum threshold for pixel area and inter-pixel spacing. Storage space for charge is also problematic, since a small area can only store some maximum amount of photo-induced charge, thereby reducing the dynamic range of the detected pixel values. The manufacturing yield of the camera sensors can also be problematic, since the presence of some number of defective pixels may result in image degradation.

Figure 4A:
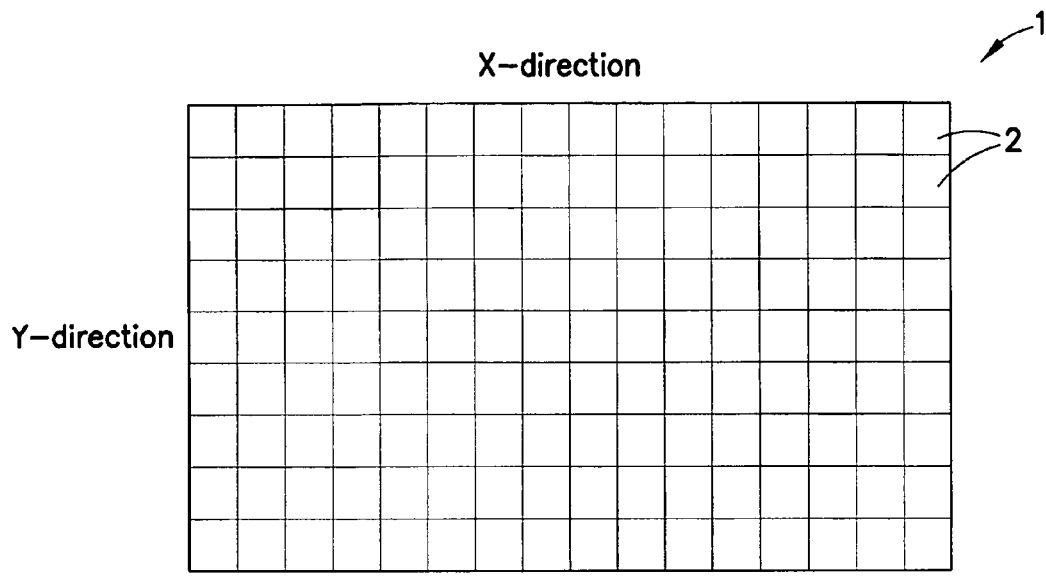
FIGS. 4A, 4B and 4C, collectively referred to herein as FIG. 4, are a simplified enlarged top view, cross-sectional view and elevational view, respectively, of a light sensor in accordance with the exemplary aspects of this invention.
Figure 4B:
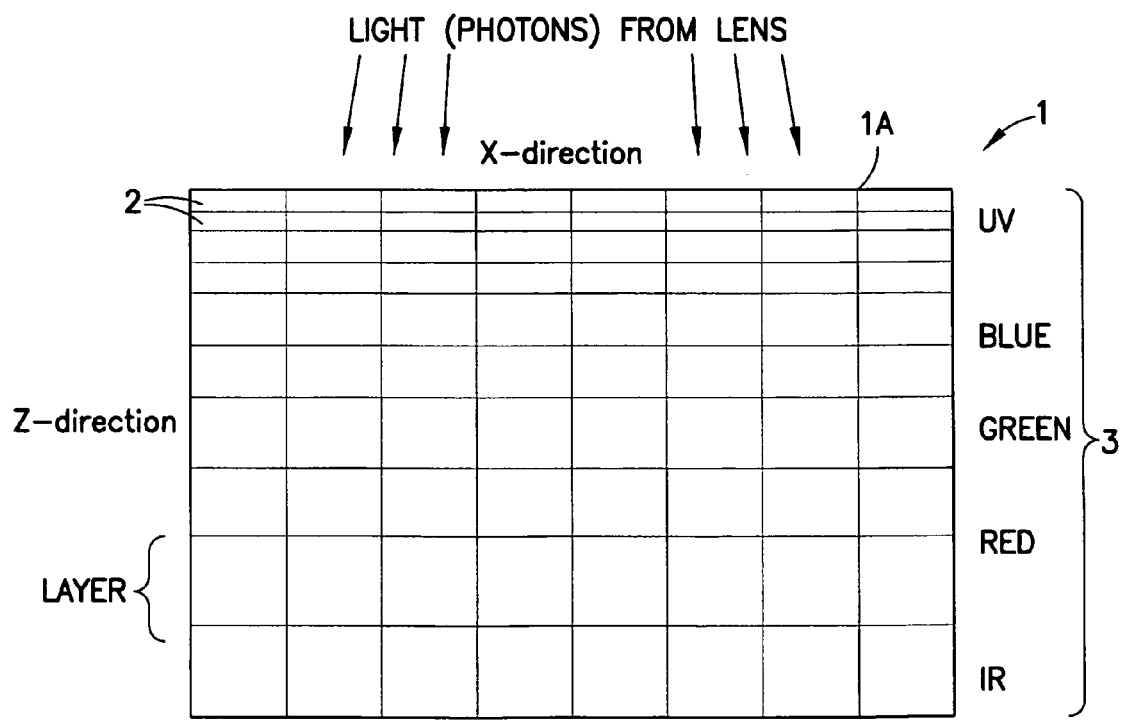
Figure 4C:
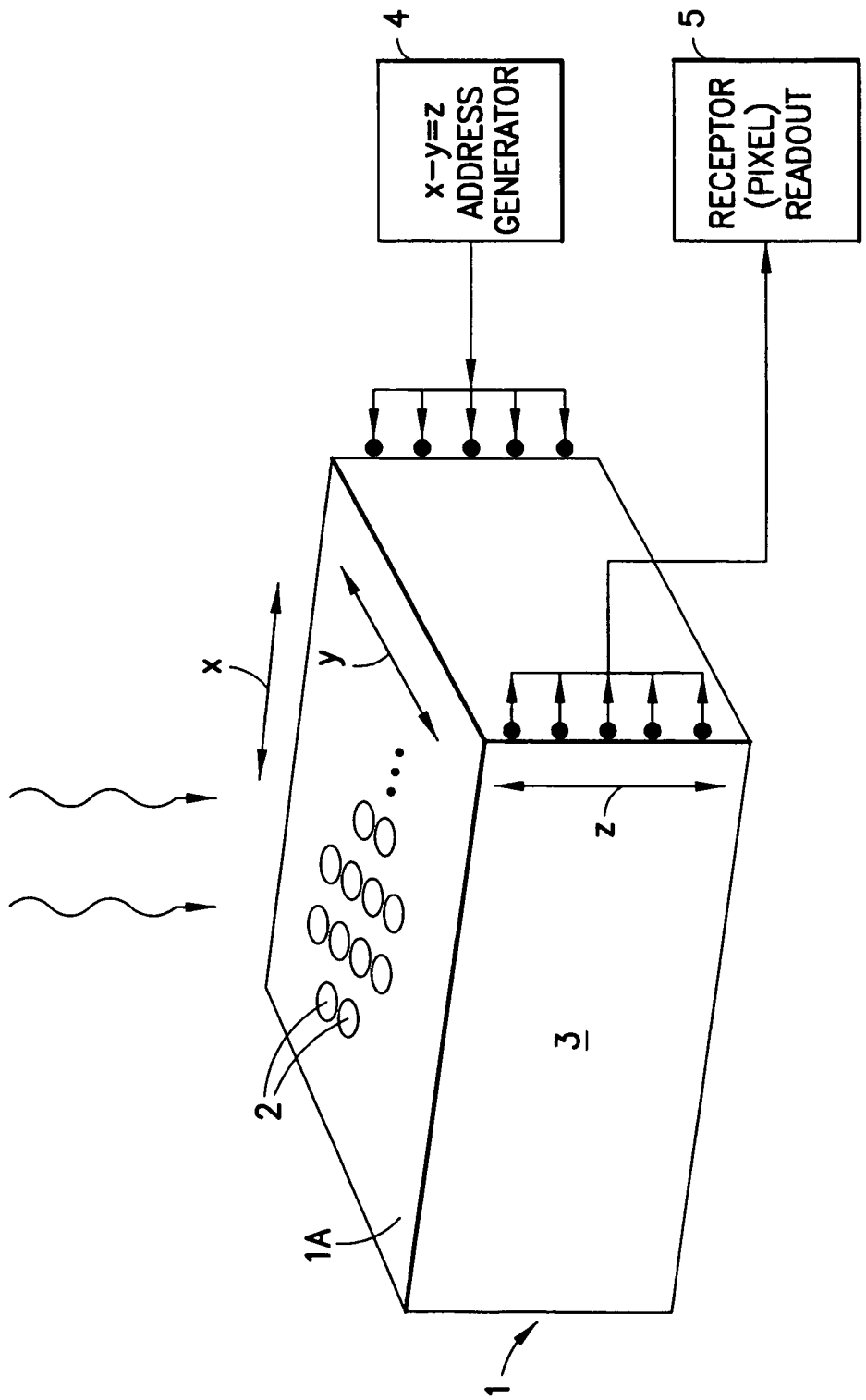

Referring to FIGS. 4A, 4B and 4C, the exemplary embodiments of this invention provide a light sensor (sensor array) 1 that contains a large number of 1-bit light receptors 2 that are arranged as a three dimensional array of light sensors. The three dimensional array is organized as i light receptors 2 along an x-axis of the array, j light receptors 2 along a y-axis of the array, and k light receptors 2 along a z-axis of the array, where i may or may not be equal to j, and where i and j may each be much larger than k. The k 1-bit light receptors 2 can be seen to be vertically stacked from a light receiving surface 1A of the sensor 1 into a depth of a substrate 3, which may be a silicon substrate. Due to the wavelength-dependent absorption coefficient of silicon, the deeper into the substrate 3 that a particular light receptor 2 is located (i.e., the further that it is located from the light receiving surface 1A) the longer is the wavelength of light that reaches it and that may be absorbed and detected. As an example, the sensor 1 may be responsive to electromagnetic radiation in the wavelength range that extends from the ultraviolet (UV) to the infrared (IR), and thus may encompass wavelengths in a range from about $4 \times 10^{-7}$ m (and shorter) to about $7 \times 10^{-7}$ m (and longer). An optional lens (not shown in FIG. 4) may be disposed between the light receiving surface 1A and the scene being imaged.

The binary value of a particular receptor 2 (either 1 or 0) indicates the state of the receptor (on or off). A scene viewed by the sensor array 1 is converted to an image, which may be a color image, by processing detected receptor values and calculating the image (resolution and colors) based on those receptor values. The x and y dimensions of the receptors 2 in a particular layer of receptors (i.e., in a particular x-y plane of receptors) correspond to a specific range of incoming wavelength, thus creating a layer of receptors sensitive to specific color range. The z dimension corresponds to a plurality of the receptor layers disposed one above another. There may also be multiple similar layers. For example, and depending on the wavelength absorption characteristics of the material of the substrate 3 and the spacing between x-y planes of receptors 2, there may be two or more adjacent layers that are responsive to, for example, light that is considered to lie in the blue, green or red portions of the electromagnetic spectrum.

In the exemplary embodiments of this invention i and j may both have a value of about $10^6$, while k may have a value of about $10^2$ or less, and each receptor 2 is capable of storing a 1-bit value (0 or 1). The wavelength of incident light defines how deeply the light travels into the sensor 1. The direction at which the light arrives is assumed to be within a field of view (FOV) of the sensor 1.

The size and form of the receptors 2 can vary. For example, in one non-limiting exemplary embodiment each receptor 2 may have a basically cubic shape (each face is approximately square), and each receptor 2 may have about the same dimensions. In other exemplary embodiments the shape of the receptors 2 may approximate a three-dimensional rectangular structure, such as are shown in FIG. 4. It may be beneficial in some embodiments that the receptors 2 that are farther from the light receiving surface 1A be thicker than (have a greater extent in the z axis) those receptors 2 that are closer to the light receiving surface 1A. It may also be beneficial in some embodiments that the receptors 2 in a center region of the sensor 1 be smaller than the receptors 2 nearer to the edges (those receptors at or near the image borders).

It may be beneficial in some embodiments to optimize the shape of the receptors 2 so that those receptors 2 in the top-most layer(s) of the sensor 1 are the smallest, with the size increasing based on the angle of the incoming light towards the bottom-most layer of receptors 2. In this manner it may be possible to obviate the need to use microlenses or a similar system to direct the light to the bottom-most layers of receptors 2. Of course, this embodiment takes into account the refraction of light due to the presence of the different materials.

Figure 7A:
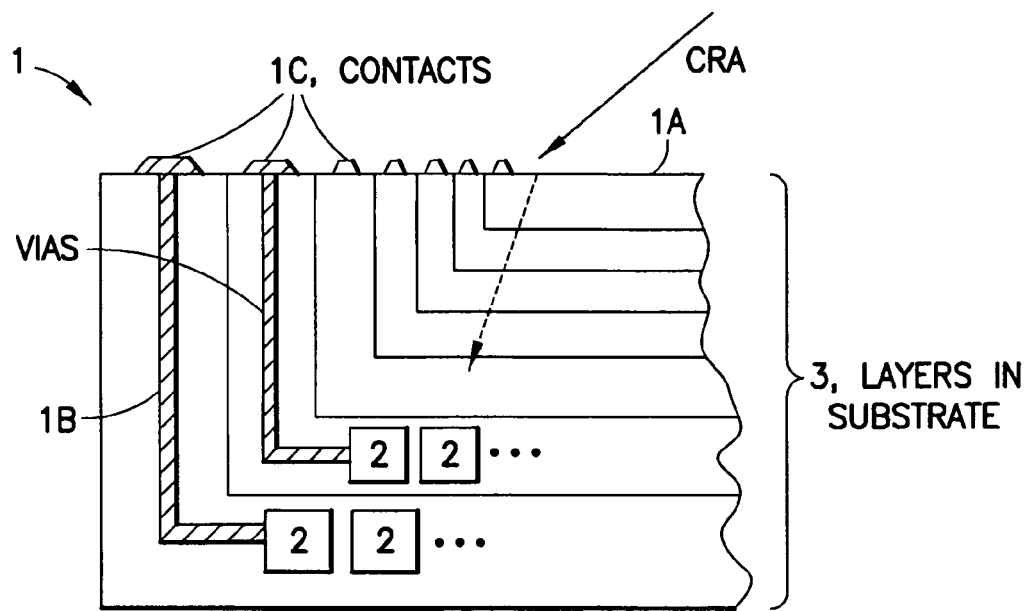
FIGS. 7A and 7B, collectively referred to as FIG. 7, are each a partial cross-sectional view of the image sensor of FIG. 4, where in FIG. 7A there is shown one exemplary embodiment where the receptor surface connections are optimized according to the chief ray angle (CRA), and where in FIG. 7B there is shown another exemplary embodiment wherein the receptor layers are shifted by an amount that is a function of the CRA.
Figure 7B:
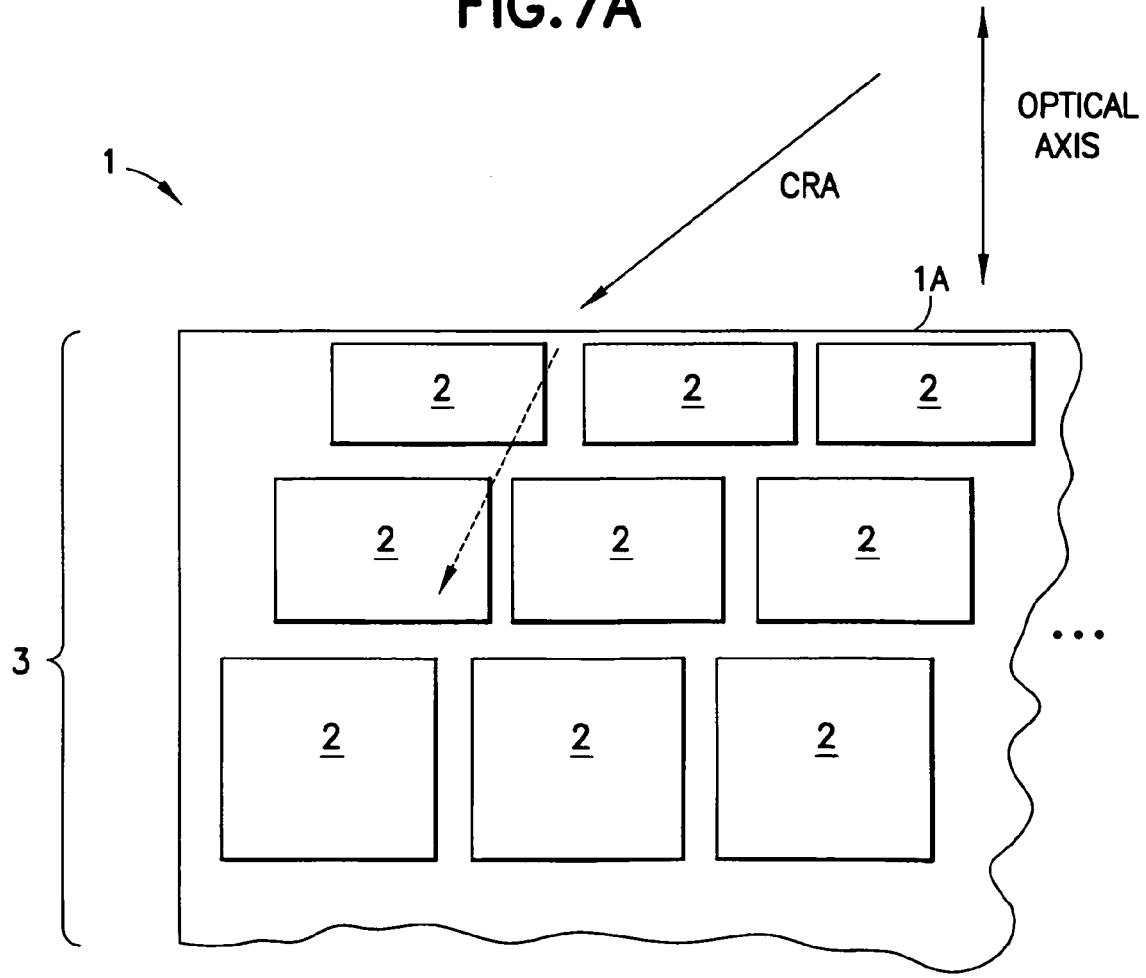

FIGS. 7A and 7B are each a partial cross-sectional view of the image sensor of FIG. 4, where in FIG. 7A there is shown one exemplary embodiment where the receptor surface connections are optimized according to the chief ray angle (CRA), and where in FIG. 7B there is shown another exemplary embodiment wherein the receptor layers are shifted (laterally offset) according to the CRA. The chief ray in an optical system is the meridional ray that starts at the edge of the object, and passes through the center of the aperture stop. This ray crosses the optical axis at the locations of the pupils. As such, chief rays may be considered to be equivalent to the rays in a pinhole camera. The distance between the chief ray and the optical axis at an image location defines the size of the image.

In the embodiment of FIG. 7A the top surface (light receiving surface 1A) connections or contacts 1C to the receptors 2 in the various layers may be made using vias 1B (only a few of which are shown). The top surface placement of the contacts 1C may be made in an optimized manner with respect to the CRA, in this case by concentrating the contacts 1C near the periphery of the light receiving surface 1A. In FIG. 7B the receptors 2 of a given layer are shifted laterally with respect to the receptors 2 in other layers, again in accordance with the CRA. Note that while the receptors 2 in adjacent layers in FIG. 7A are also shown as being shifted laterally, in other embodiments they may be also arranged so as to directly underlie one another (i.e., to be vertically registered one with another). Note further that in some embodiments the receptors 2 in only some layers may be shifted laterally between layers, while in other layers the receptors may underlie one another and be registered vertically, such as is shown in FIGS. 4A and 4B.

Note as well that it is within the scope of these exemplary embodiments to also consider, when designing the placement and/or sizes of the receptors 2, the refraction of light within the semiconductor substrate (e.g., a Si substrate) and the change in angle from the incidence angle (shown dashed in FIGS. 7A and 7B) of the light within the substrate.

The thickness of the layers is defined based on the light absorption properties within the material of the sensor 1 (e.g., silicon) and the desired accuracy of detection at different wavelengths. One non-limiting approach is to make the thickness of the receptors 2 (and/or the number k of the z-axis receptors) spatially varying (e.g., the center area may contain more and thinner receptors 2 along the z-axis than at the edge/corner areas of the sensor 1).

The receptors 2 may have different sizes in different layers (e.g., see FIGS. 4B, 7A and 7B). For example, the green light absorbing layer (that layer that absorbs wavelengths of visible green color) may use more (and physically smaller) receptors 2 than the red, blue or IR responsive layers.

Figure 1:
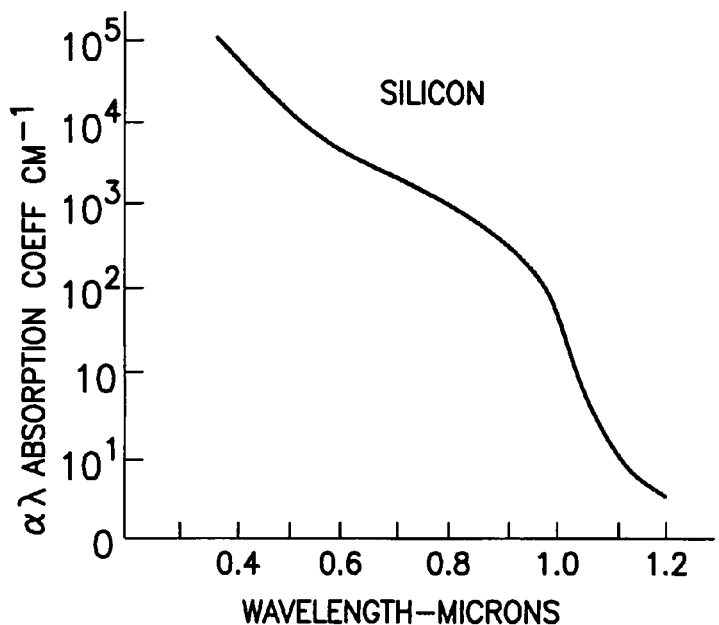
FIG. 1 shows a graph that plots the absorption coefficient of silicon (Si) as a function of wavelength.
Figure 2:
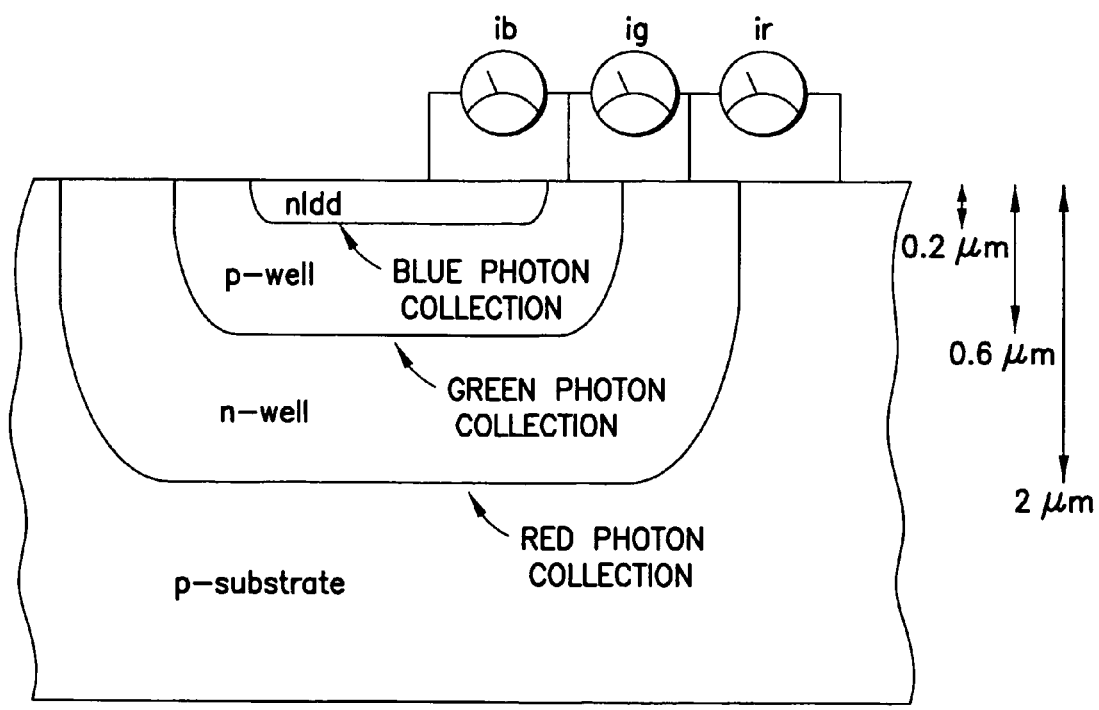
FIG. 2 shows in cross-section a three-color pixel sensor that uses a triple-well structure.
Figure 3:
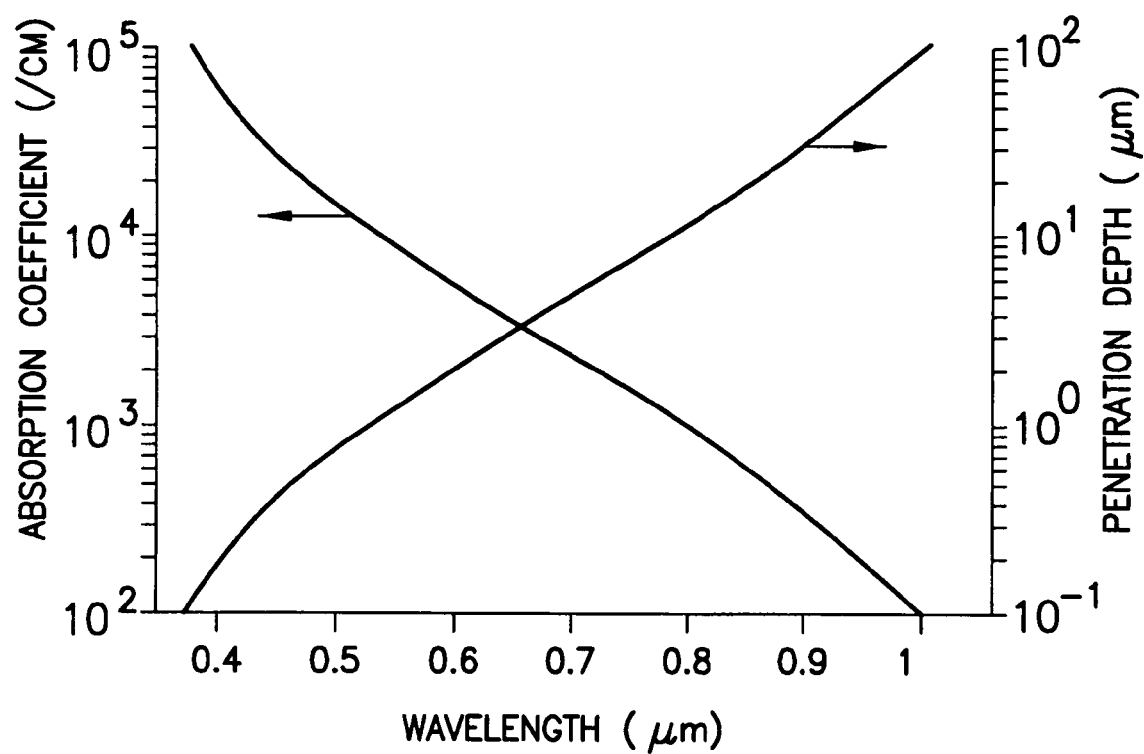
FIG. 3 depicts a graph that plots light absorption length in Si versus wavelength.
Figure 8:
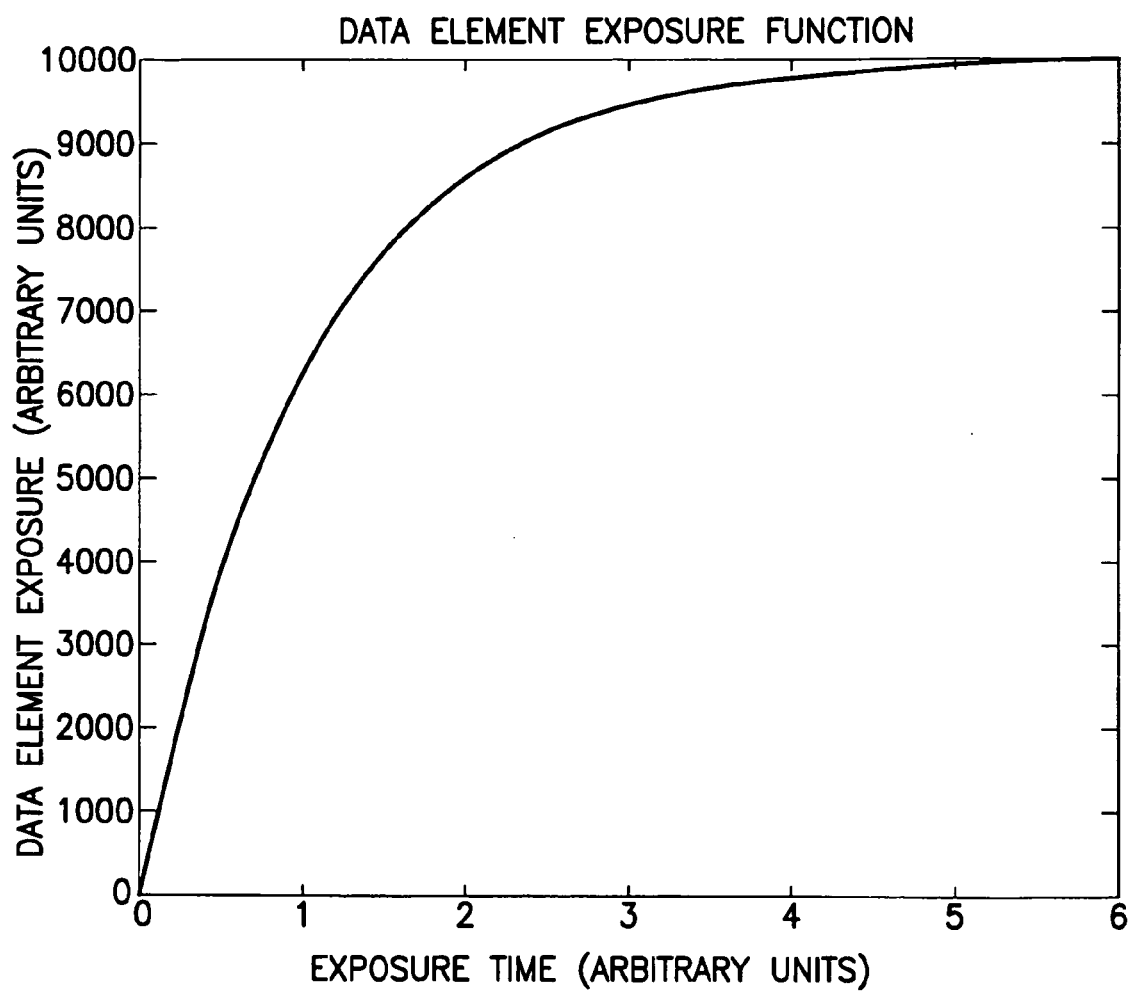
FIG. 8 is a graph that plots data element exposure versus exposure time (both in arbitrary units), and is useful in understanding the operation of the image sensor shown in FIG. 4.

During operation, the individual receptors 2 of the sensor array 1 are reset to a known state (0 or 1). When light impinges on the sensor array 1 it is absorbed (selectively in depth as a function of wavelength as shown in FIGS. 1 and 3) by certain ones of the receptors 2 and changes the state of those receptors (1 or 0). After some time period the sensor array 2 has captured a large number of photons and some possibly correspondingly large number of receptors 2 have experienced a change of state. At a point where there are more receptors 2 with value (1 or 0, i.e., receptors that have changed state from the initial reset state) then the probability that a photon will impinge on a receptor that is still in the reset state decreases. This results in the sensor 1 beginning to saturate. This type of nonlinear behavior may be taken into account when the receptor (pixel) values are subsequently processed. Reference in this regard may be made to the non-limiting example of FIG. 8, where it may be seen that as the exposure time increases the number of receptors 2 (which may be referred to as "data elements") asymptotically approaches some maximum value. After some desired exposure period the values of the receptors 2 are read out. A three-dimensional image may then be processed into a color image with a desired resolution and color accuracy by combining the bit values in different directions (resolution in the x and y axes) and colors in the z-axis. Dynamics of the processed image are based on the amount of combined receptor values from different directions (and noise).

The exposure time of the sensor 1 may be based on previously captured image(s). It is also within the scope of the exemplary embodiments, if there is some mechanism in place that enables one to determine a number of receptors 2 that have changed state, to terminate the exposure after some threshold number of receptors 2 have changed state (e.g., 15%). This mechanism may be based on performing multiple successive non-destructive read cycles of the sensor 1, and continuing until some threshold number of receptors 2 has changed state.

Note that while the sensor 1 is wavelength (color) responsive, and thus finds utility as a color imager or a spectral imager, it may be used as well to create black and white and monochrome images. If the amount of incident light is small it may be beneficial to process only reduced resolution luminance information from the sensor 1. When the scene is lighter then the resolution, and also color accuracy, may be increased.

As is shown in FIG. 4, it is within the scope of these exemplary embodiments to design the sensor 1 so that it captures different wavelengths of light in different layers, e.g., the top-most layer(s) may capture UV light, the next layers capture visible light and the bottom-most layers capture IR light. All or some of these layers may be used when forming the output image or for detection purposes.

The outputs of the receptors 2 may be combined both laterally (within a layer) and vertically (between two or more layers). Receptors 2 along the x-direction are used for x-resolution, receptors 2 along the y-direction for y-resolution, and receptors 2 along the z-direction for color accuracy. A plurality of adjacent receptors 2 may be grouped together to form a single image pixel, and the number of receptors in a particular group may change from exposure to exposure, and the number may be different for different groups during a single exposure. For example, there may be fewer receptors 2 per group towards the center of the light receiving surface 2A and more receptors 2 per group at the edges of the light receiving surface 2A.

Assume as a non-limiting case the sensor 1 having nine layers, with the read-out receptor values along the z-axis being 1 1 0 0 0 1 1 1 1 from bottom to top. In this case one may create, for example, RGB pixel with values 2 1 3 or 1 0 1 depending on the value resolution. Similarly these values can be further combined with receptor values in the x and y directions and then, e.g., receptors 2 within a 16×16×9 receptor volume can form RGB pixel values with 8-bit dynamic resolution or even approximately 10-bit dynamic resolution (e.g., 3×16×16=768). It is possible that the sensor 1 be capable of combining bit elements (individual data values) as data elements (combined data values). The data that is read out from the digital sensor 1 may be either bit-valued (binary) data or multi-valued data elements.

By way of further explanation, and assuming the use of the example described above, it can be seen that 1 1 0 0 0 1 1 1 1 is not a binary number but on/off values for different layers. Therefore, one may sum the receptors 2 that have turned on (i.e., 1+1+0=2, 0+0+1=1, 1+1+1=3, or 213). If it is desired to change the value resolution because of noise, for example, one may change the threshold. In this case a threshold of 1.5 would turn the value 213 into 101 (i.e., 2>1.5→1, 1<1.5→0, 3>1.5→1) and the signal-to-noise ratio is thus increased. It is also within the scope of the exemplary embodiments that there are provided a different amount of receptors 2 in different colors (e.g., 3 for B, 4 for G and 2 for R). Then the combined values are 2 2 2 and the thresholds are 1.5, 2 and 1→1 1 1. In the first example the 16×16×9 volume can enable 10-bit dynamic resolution for G, 9 bit dynamic resolution for R, and 9.5 bit dynamic resolution for B. When the values are combined within a threshold then the dynamic resolution is still only 8-bit for each color due to the use of the 16×16 volume (in this non-limiting example). In addition, other combinations are possible since some layers may be used for UV and/or IR detection.

The sensor 1 may be used for other purposes than for image capture. For example, distance may be based on the detection of the bottom-most (e.g., the IR) layer. In this case assume a presence of an IR light source at a device that includes the sensor 1 (e.g. a camera). The time difference between when the IR light source is activated and when IR light reflected from an object is measured. The distance to the object can thus be determined as being based on half of the round trip travel time of the IR light. This type of measurement system may be used, for example, to assist auto-focus (AF) functionality during image capture.

The array of receptors 2 may be read, for example, by using technology similar to that found in random access memory, such as dynamic random access memory (DRAM). That is, the sensor 1 may be viewed as representing an array of i×j×k addressable one bit storage locations (see also FIG. 4C). The sensor 1 may be configured such that the receptor values are always reset during a read cycle, or it may be configured that the reset operation is performed separate from the read operation.

Note that in FIG. 4C the electrical connections are shown for convenience as being made to the vertical sides of the substrate 3, and not by way of limitation. For example, in certain embodiments it may more preferred to provide the electrical contacts at the top surface (the light receiving surface 1A) as shown in FIG. 7A, or at the bottom surface, or at both the top and bottom surfaces.

Due to the potentially large number of receptors 2 (e.g., $9 \times 10^{12}$ for an array of size $10^6 \times 10^6 \times 9$) each individual receptor may be designed to have minimal complexity, thereby enabling the sensor 1 to be manufactured with increased yield as compared to conventional sensor arrays. Any defective receptors 2, e.g., those with stuck at zero or stuck at one faults, may be identified and their locations mapped and compensated for (such as by using interpolation from adjacent operational receptors 2) during image processing.

The electrical contacts and related circuitry may be either on the top of the sensor array 1 or, possibly more preferably, at the bottom of the sensor array 1 (backside contact). Alternatively, some receptors 2 may be contacted from the top of the sensor array 1 while others may be contacted from the bottom of the sensor array 1.

FIG. 4C shows the sensor array 1 with exemplary x-y-z address generation circuitry 4 and receptor (pixel) readout circuitry 5. The receptor readout circuitry 5 receives from the sensor array 1 a stream or streams of essentially binary data (one and zeros) corresponding to those receptors 2 that are turned on (i.e., that have absorbed at least one photon) and those receptors 2 that have not turned on (i.e., are still in the reset state by virtue of not having absorbed at least one photon, or some threshold number of photons). The receptor readout circuitry 5 may also be responsible for grouping together the outputs of light receptors into x-y and/or z-axis light receptor groups or neighborhoods. The receptor readout circuitry 5 may include a compression function (any suitable compression function may be used, such as run-length encoding), or there may be a separate compression function prior to storage of the readout receptor values. The address generation circuitry 4 may generate, at any given time, addresses to readout the receptors 2 layer-wise (row-by-row) or vertically column-by-column.

The receptor circuitry need not be as complex as that found in many conventional CMOS/CCD sensors, as there is no need to measure floating diffusion current/voltage with an A/D converter. Instead, it is only needed to measure that a particular receptor 2 (pixel) is on or off. Multiple p-n and n-p junctions may be used, but other alternatives can also be used. Also the size of a p-well or n-well (or the substrate) can be much smaller than in conventional CMOS/CCD sensors, since there is no need to store a large amount of charge.

Figure 5:
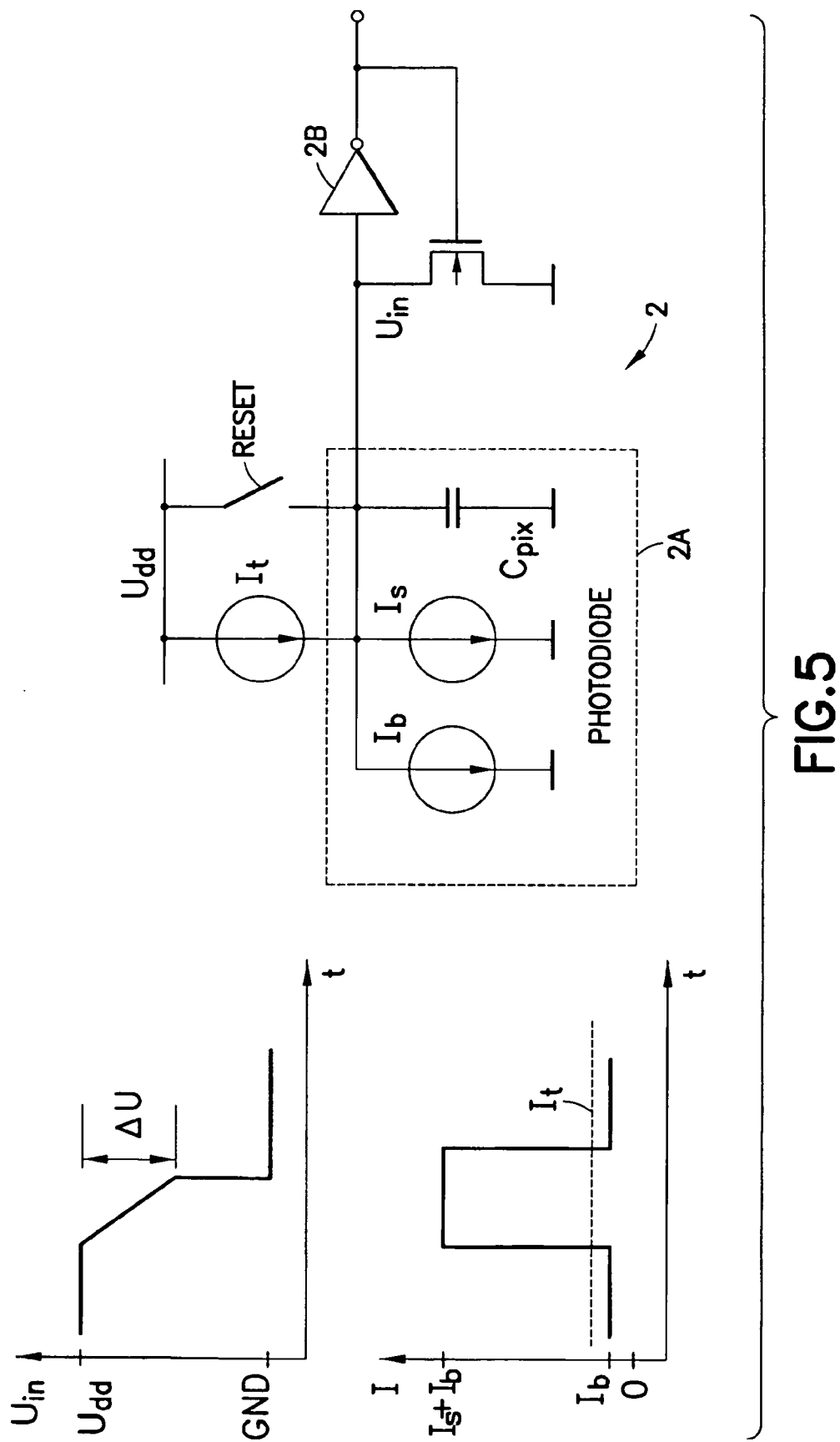
FIG. 5 depicts one suitable and non-limiting type of circuitry to implement the receptors of the light sensor of FIG. 4.

One suitable and non-limiting type of circuitry to implement the receptors 2 is shown in FIG. 5. In this case each receptor 2 includes a photodiode 2A connected with a simple inverter-based comparator circuit 2B for one-bit amplitude quantification. An adjustable threshold current may be used to prevent triggering due to background illumination. A receptor (pixel) is triggered when the signal current (plus background current) exceeds the threshold current $I_t$, and the voltage $U_{in}$ across $C_{pix}$ due to the discharging current $I_s+I_b-I_t$ goes below the threshold voltage ($\sim -U_{dd}/2$) of the comparator 2B. Assuming that $I_t$ is small compared with the amplitude of the signal pulse, the sensitivity of a pixel is determined by the optical energy $E_{pix}$ needed for discharging the input capacitance of a pixel:

$$E_{pix} \approx (C_{pix} \Delta U)/SK_F,$$

where $C_{pix}$ is the total input capacitance of a pixel, comprising the photodiode and circuit input capacitances, $\Delta U$ is the voltage change at the input needed to trigger the comparator 2B, S is the photodiode responsivity and KF the pixel fill factor.

It is also within the scope of these exemplary embodiments to combine three dimensional spatial bit images that are captured at different times and so enable four dimensional bit image capture that can be used either for still or video images.

In certain embodiments of this invention the substrate 3 can be composed of a different materials selected for being responsive to different wavelength bands. For example, the visible light detection portion may be comprised of Si, while a UV light detection portion (if present) may be comprised of a Group III-V material, such as GaN or AlGaN, or another material such as SiC, as a few non-limiting examples. Further by example, the visible light detection portion may be comprised of Si, while an IR light detection portion (if present) may be comprised of a material such as InGaAs, PbSe, InSb or HgCdTe, as a few non-limiting examples. Note that Si may also be IR responsive.

It is also within the scope of the exemplary embodiments of this invention to selectively vary at least one dimension, such as the dimension along the z-axis, of the receptors 2 in different layers so as to enhance there responsivity to the wavelength(s) of light to be detected in a particular layer. In this case the at least one dimension may be made some fraction of a wavelength, thereby wavelength tuning the receptors 2 in that layer.

In general, the dimensions of the receptors in the x and y axes may be, for example, in the range of about 0.1 to about 0.2 micrometers, while the thicknesses may vary depending upon the wavelength range that is detected in the corresponding layer of the sensor 1 and possibly also the desired color accuracy and number of layers. The actual minimum dimensions of a receptor 2 may be assumed to depend at least in part on the specifics of the fabrication process, such as the wavelengths used for photolithography and similar process-dependent parameters.

In general, one may tune the z-axis depth according to desired color fidelity, and this depth tuning may or may not be uniform for all color channels. Also, in some cases one may provide a variance in the depth to create a statistical distribution for bit elements underlying one data element.

While one may tune the dimensions of the receptors 2 along the z-axis for color dynamics, as was noted above one may also tune the dimensions of the receptors 2 along the x-y axes in response to an uneven distribution of light, especially at edges of the image sensor 1.

In general, the dimensions and distributions of the receptors 2 may be made a function of the sensor/device geometry, and may be based on a consideration of the chief ray angle (CRA).

The fabrication of the sensor array 1 may be accomplished by any suitable techniques, including one or more of forming multiple implanted/diffused p-n/n-p junctions, by the use of multiple epitaxy/pattern/planarize processing steps to form the individual layers superimposed one above another, and by the use of wafer bonding processing (as non-limiting examples). Other technologies may also be used, such as through silicon via (TSV) or through silicon stacking (TSS) technology, to provide for vertically stacking substrates/wafers containing the receptors 2.

Figure 6:
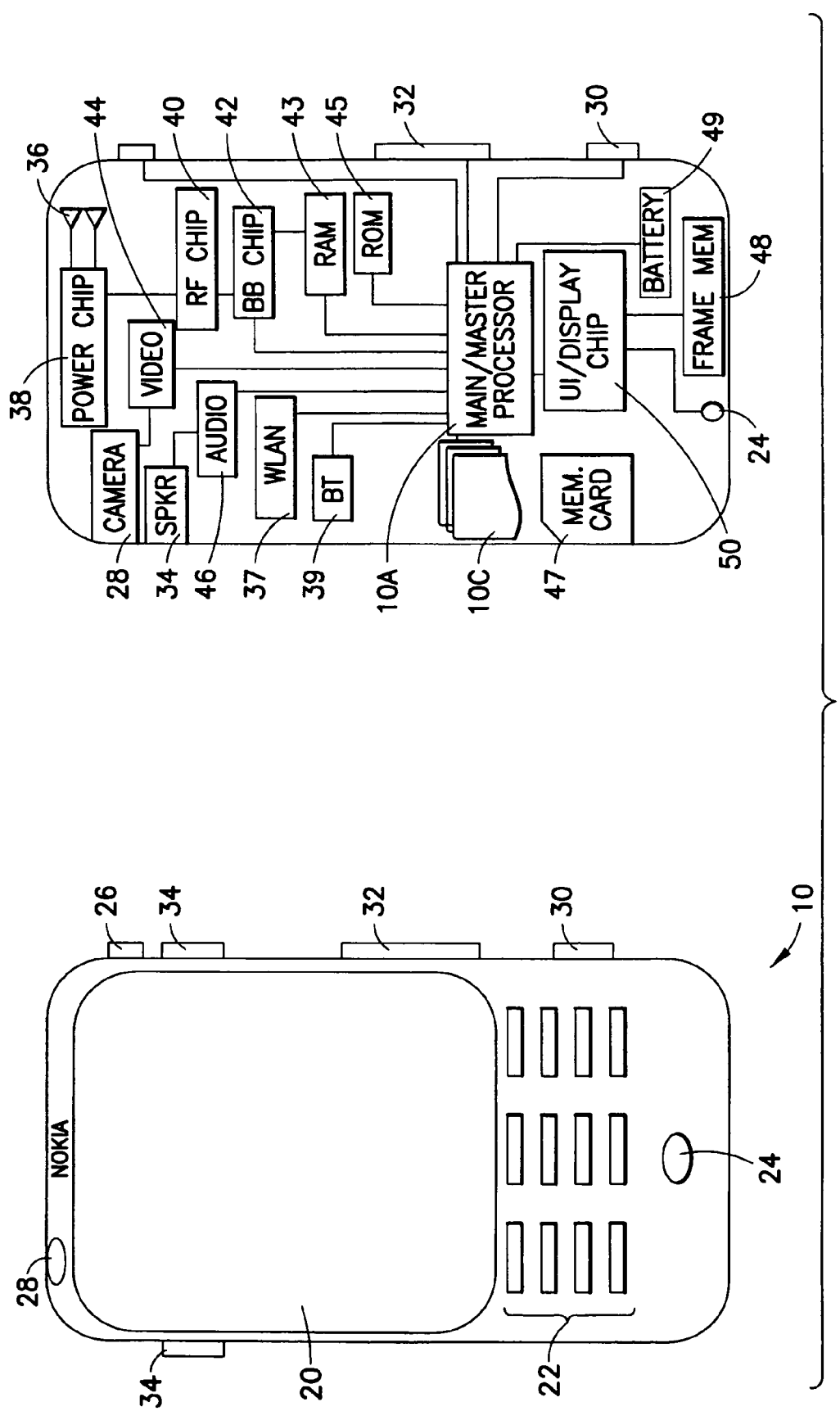
FIG. 6 shows a block diagram of a device that may be constructed to include the image sensor in accordance with the exemplary embodiments of this invention.

FIG. 6 illustrates an exemplary embodiment of a device, such as user equipment (UE) 10, in both plan view (left) and sectional view (right). In FIG. 6 the UE 10 has a graphical display interface 20 and a user interface 22 illustrated as a keypad but understood as also encompassing touch screen technology at the graphical display interface 20 and voice recognition technology received at the microphone 24. A power actuator 26 controls the device being turned on and off by the user.

The exemplary UE 10 includes a camera 28 which is shown as being forward facing (e.g., for video calls) but may alternatively or additionally be rearward facing (e.g., for capturing images and video for local storage). The camera 28 is controlled by a shutter actuator 30 and optionally by a zoom actuator 30 which may alternatively function as a volume adjustment for the speaker(s) 34 when the camera 28 is not in an active mode.

The camera 28 may be assumed to include an image sensor array 1 that is constructed and operated in accordance with the exemplary embodiments of this invention, as described in detail above.

Within the sectional view of FIG. 6 are seen multiple transmit/receive antennas 36 that are typically used for cellular communication. The antennas 36 may be multi-band for use with other radios in the UE. The operable ground plane for the antennas 36 is shown by shading as spanning the entire space enclosed by the UE housing though in some embodiments the ground plane may be limited to a smaller area, such as disposed on a printed wiring board on which the power chip 38 is formed. The power chip 38 controls power amplification on the channels being transmitted and/or across the antennas that transmit simultaneously where spatial diversity is used, and amplifies the received signals. The power chip 38 outputs the amplified received signal to the radio frequency (RF) chip 40 which demodulates and downconverts the signal for baseband processing. The baseband (BB) chip 42 detects the signal which is then converted to a bit stream and finally decoded. Similar processing occurs in reverse for signals generated in the apparatus 10 and transmitted from it.

Signals going to and from the camera 28 may pass through an image/video processor 44 that encodes and decodes the various image frames. A separate audio processor 46 may also be present controlling signals to and from the speakers 34 and the microphone 24. The graphical display interface 20 is refreshed from a frame memory 48 as controlled by a user interface chip 50 which may process signals to and from the display interface 20 and/or additionally process user inputs from the keypad 22 and elsewhere.

Certain embodiments of the UE 10 may also include one or more secondary radios such as a wireless local area network radio WLAN 37 and a Bluetooth radio 39, which may incorporate an antenna on the chip or be coupled to an antenna off the chip. Throughout the apparatus are various memories such as random access memory RAM 43, read only memory ROM 45, and in some embodiments there may be removable memory such as the illustrated memory card 47 on which the various programs 10C are stored. All of these components within the UE 10 are normally powered by a portable power supply such as a battery 49.

The processors 38, 40, 42, 44, 46, 50, if embodied as separate entities in a UE 10, may operate in a slave relationship to the main processor 10A, 12A, which may then be in a master relationship to them. Embodiments of this invention may be disposed across various chips and memories as shown, or disposed within another processor that combines some of the functions described above for FIG. 6. Any or all of these various processors of FIG. 6 access one or more of the various memories, which may be on chip with the processor or separate there from. Similar function-specific components that are directed toward communications over a network broader than a piconet (e.g., components 36, 38, 40, 42-45 and 47) may also be disposed in exemplary embodiments of the access node 12, which may have an array of tower mounted antennas rather than the two shown at FIG. 6.

Note that the various integrated circuits (e.g., chips 38, 40, 42, etc.) that were described above may be combined into a fewer number than described and, in a most compact case, may all be embodied physically within a single chip.

Referring to FIG. 9 there is illustrated a logic flow diagram that is descriptive of the operation of a method, as well as the execution of computer program instructions, in accordance with exemplary embodiments of this invention. At Block 9A the method includes an operation of illuminating a light receiving surface of substrate comprising a three dimensional array of light receptors, where light receptors disposed in an x-y plane that is closer to the light receiving surface are responsive to light having shorter wavelengths than light receptors disposed in an x-y plane that is further from the light receiving surface, and where each light receptor is configured to output a binary value and to change state between an off-state and an on-state by the absorption of at least one photon. At Block 9B there is an operation, performed at the end of an exposure period, of reading out binary values from light receptors disposed in at least two different x-y planes of the three dimensional array.

In the method of the preceding paragraph, where illuminating includes a preliminary step of resetting the light receptors to the off-state.

In the method of the preceding paragraph, further comprising grouping together the binary outputs of some number of adjacent light receptors.

In the method of the preceding paragraph, where grouping together groups together the binary outputs of some number of light receptors that are adjacent in the same x-y plane of the three dimensional array, or that groups together the binary outputs of some number of light receptors that are adjacent along a z-axis of the three dimensional array, or that groups together the binary outputs of some number of light receptors that are adjacent in the same x-y plane and along the z-axis of the three dimensional array.

In the method of the preceding paragraphs, further comprising changing the grouping of light receptors from one exposure to the next.

In the method of the preceding paragraphs, further comprising compressing the binary values that are read out from the sensor array.

In the method of the preceding paragraphs, executed during operation of an image sensor within a wireless communication device.

There are a number of advantages and technical effects that are achieved by the use of the exemplary embodiments of this invention. For example, sensor array sensitivity can be improved, the yield of the image sensors can be improved, color accuracy can be improved, resolution can be improved, and the dynamics of the pixel values can be improved. In addition, any compromise between resolution and color accuracy can be made dynamically. In addition, many different optimization possibilities are available due at least to the simplicity of the basic sensor structure. In addition, the sensor array 1 is easy to use and integrate, since all the receptors 2 provide just values of 0 and 1. In addition, there is no need to provide separate color filters, or an IR filter, or to provide microlenses.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the exemplary embodiments of this invention are not limited thereto. While various aspects of the exemplary embodiments of this invention may be illustrated and described as block diagrams, schematic diagrams or using some other pictorial representation, it is well understood that these blocks, apparatus, systems, techniques or methods described herein may be implemented in, as non-limiting examples, at least in part as hardware, software, firmware, special purpose circuits or logic, general purpose hardware or controller or other computing devices, or some combination thereof.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

For example, while the exemplary embodiments have been described above in FIG. 6 the context of a wireless communications device such as the UE 10, it should be appreciated that the exemplary embodiments of this invention are not limited for use with only this one particular type of wireless communication device, and that they may be used to advantage in other types of devices that may or may not have wireless communications capability, including digital cameras, PDAs, computers and gaming devices, as non-limiting examples.

Further by example, individual receptors 2 need not be transistor/photodiode based, but may be constructed using other types of devices, including quantum dots and other nanostructure devices.

Further by example, it should be realized that the various values given above for the numbers of receptors along the various axes are exemplary, and are not to be construed as being limiting.

Further by example, the exemplary embodiments of this invention are not to be construed as being limited to any of the specific materials, combinations of materials, fabrication processes, wavelengths and/or dimensions that were mentioned above.

Further by example, in a particular embodiment not all layers of the sensor array 1 need be populated with receptors 2. For example, and assuming a non-limiting case of an application where it was desired to detect only blue light and red light, then only those portions of the substrate 3 receptive to these wavelengths need include receptors 2, thereby effectively notch filtering out the wavelengths of light that lie between blue and red. The same effect may be achieved by providing the sensor array 1 that is responsive to all wavelengths in the range of blue to red, and then only reading out the layer or layers of receptors 2 that are responsive to blue and the layer or layers of receptors 2 that are responsive to red.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. An apparatus comprising:
a three dimensional array of light receptors disposed within a substrate having a light receiving surface, wherein the light receptors in the three dimensional array are disposed in layers, and wherein at least some light receptors in a first layer are disposed so as to be laterally shifted with respect to at least some light receptors in an adjacent layer,
wherein light receptors disposed closer to the light receiving surface are responsive to light having shorter wavelengths than light receptors disposed further from the light receiving surface,
wherein each light receptor is constructed to change state between an off-state and an on-state by the absorption of at least one photon and comprises a photodiode and a circuit configured to perform one-bit quantification, wherein a circuit for each single one of the light receptors outputs a one-bit binary value indicative of whether or not only the photodiode for the single light receptor absorbed enough optical energy to cause the single light receptor to change state between the off-state and the on-state, wherein the circuit configured to perform one-bit quantification comprises a comparator, wherein each light receptor further comprises a current source producing a threshold current ($I_t$) as input to the photodiode, and wherein each light receptor is triggered to the on-state in response to signal current ($I_s$) caused by absorption of optical energy plus background current ($I_b$) for the photodiode exceeding the threshold current, and in response to the voltage produced by the photodiode due to discharging current of $I_s + I_b - I_t$ falling below a threshold voltage of the comparator.

2. The apparatus as claimed in claim 1, responsive to electromagnetic radiation in a wavelength range that includes at least from about $4 \times 10^{-7}$ m to about $7 \times 10^{-7}$ m.

3. The apparatus as claimed in claim 1, wherein each light receptor has about the same dimensions along an x-axis, a y-axis and a z-axis.

4. The apparatus as claimed in claim 1, wherein at least some light receptors disposed further from the light receiving surface have a larger dimension along a z-axis than light receptors disposed closer to the light receiving surface.

5. The apparatus as claimed in claim 1, wherein light receptors disposed nearer to an axis passing through a center of the light receiving surface have a smaller dimension along at least one of an x-axis and a y-axis than light receptors disposed further from the axis passing through the center of the light receiving surface.

6. The apparatus as claimed in claim 1, wherein the light receptors are disposed in layers, wherein those light receptors within a particular layer are responsive to the same wavelengths of light, and wherein at least some light receptors in a first layer are disposed directly beneath some light receptors in an adjacent layer.

7. The apparatus as claimed in claim 1, wherein those light receptors within a particular layer are responsive to the same wavelengths of light.

8. The apparatus as claimed in claim 7, wherein the at least some light receptors in the first layer are laterally shifted by an amount that is a function of a chief ray angle.

9. The apparatus as claimed in claim 1, wherein an individual light receptor has at least one dimension that is related to wavelengths of light to which the light receptor is responsive.

10. The apparatus as claimed in claim 1, further comprising electrical contacts disposed along a periphery of the light receiving surface.

11. The apparatus as claimed in claim 1, embodied as part of an image sensor within a device.

12. The apparatus as claimed in claim 11, wherein the device comprises a wireless communication device.

13. The apparatus as claimed in claim 1, wherein the apparatus is responsive to electromagnetic radiation in a wavelength range that extends from the ultraviolet to the infrared.

14. The apparatus as claimed in claim 1, wherein the voltage produced by the photodiode is due to the discharging current causing a voltage across an input capacitance of the light receptor.

* * * * *